(12) United States Patent
Chen et al.

(10) Patent No.: US 10,504,856 B2
(45) Date of Patent: Dec. 10, 2019

(54) SCHEME FOR CONNECTOR SITE SPACING AND RESULTING STRUCTURES

(71) Applicant: Taiwan Semiconductor Manufacturing Company, Ltd., Hsin-Chu (TW)

(72) Inventors: Yu-Feng Chen, Hsin-Chu (TW); Yen-Liang Lin, Taichung (TW); Tin-Hao Kuo, Hsin-Chu (TW); Sheng-Yu Wu, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 15/339,257

(22) Filed: Oct. 31, 2016

(65) Prior Publication Data

US 2017/0047298 A1    Feb. 16, 2017

Related U.S. Application Data

(63) Continuation of application No. 14/942,756, filed on Nov. 16, 2015, now Pat. No. 9,484,317, which is a
(Continued)

(51) Int. Cl.
*H01L 23/485* (2006.01)
*H01L 23/00* (2006.01)
(Continued)

(52) U.S. Cl.
CPC .......... *H01L 23/562* (2013.01); *H01L 21/768* (2013.01); *H01L 23/3157* (2013.01);
(Continued)

(58) Field of Classification Search
CPC ... H01L 23/485; H01L 23/4824; H01L 24/14; H01L 23/3171; H01L 21/768;
(Continued)

(56) References Cited

U.S. PATENT DOCUMENTS

| 5,943,597 A | 8/1999 | Kleffner et al. |
| 6,218,281 B1 | 4/2001 | Watanabe et al. |

(Continued)

FOREIGN PATENT DOCUMENTS

| CN | 101504935 A | 8/2009 |
| JP | H01187948 A | 7/1989 |

(Continued)

*Primary Examiner* — Amar Movva
(74) *Attorney, Agent, or Firm* — Slater Matsil, LLP

(57) ABSTRACT

A system and method for preventing cracks in a passivation layer is provided. In an embodiment a contact pad has a first diameter and an opening through the passivation layer has a second diameter, wherein the first diameter is greater than the second diameter by a first distance of about 10 µm. In another embodiment, an underbump metallization is formed through the opening, and the underbump metallization has a third diameter that is greater than the first diameter by a second distance of about 5 µm. In yet another embodiment, a sum of the first distance and the second distance is greater than about 15 µm. In another embodiment the underbump metallization has a first dimension that is less than a dimension of the contact pad and a second dimension that is greater than a dimension of the contact pad.

20 Claims, 11 Drawing Sheets

Related U.S. Application Data continuation of application No. 14/302,117, filed on Jun. 11, 2014, now Pat. No. 9,190,348, which is a continuation-in-part of application No. 13/667,330, filed on Nov. 2, 2012, now Pat. No. 9,472,521.

(60) Provisional application No. 61/653,277, filed on May 30, 2012.

(51) Int. Cl.
   *H01L 21/768* (2006.01)
   *H01L 23/31* (2006.01)

(52) U.S. Cl.
   CPC ........ *H01L 23/3171* (2013.01); *H01L 23/485* (2013.01); *H01L 24/02* (2013.01); *H01L 24/05* (2013.01); *H01L 24/11* (2013.01); *H01L 24/13* (2013.01); *H01L 24/14* (2013.01); *H01L 24/03* (2013.01); *H01L 2224/0231* (2013.01); *H01L 2224/0237* (2013.01); *H01L 2224/0361* (2013.01); *H01L 2224/03912* (2013.01); *H01L 2224/03914* (2013.01); *H01L 2224/0401* (2013.01); *H01L 2224/05005* (2013.01); *H01L 2224/05022* (2013.01); *H01L 2224/0558* (2013.01); *H01L 2224/05124* (2013.01); *H01L 2224/05147* (2013.01); *H01L 2224/05572* (2013.01); *H01L 2224/1146* (2013.01); *H01L 2224/1147* (2013.01); *H01L 2224/13083* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13169* (2013.01); *H01L 2224/13171* (2013.01); *H01L 2224/13172* (2013.01); *H01L 2224/13184* (2013.01); *H01L 2224/16238* (2013.01); *H01L 2924/00014* (2013.01); *H01L 2924/01322* (2013.01); *H01L 2924/381* (2013.01)

(58) Field of Classification Search
   CPC ........... H01L 2224/0401; H01L 23/562; H01L 2224/0501–05019
   See application file for complete search history.

(56) References Cited

U.S. PATENT DOCUMENTS

| | | | |
|---|---|---|---|
| 6,229,220 B1 | 5/2001 | Saitoh et al. | |
| 6,469,370 B1 | 10/2002 | Kawahara et al. | |
| 6,578,754 B1 | 6/2003 | Tung | |
| 6,592,019 B2 | 7/2003 | Tung | |
| 6,693,361 B1 | 2/2004 | Siniaguine et al. | |
| 6,818,545 B2 | 11/2004 | Lee et al. | |
| 6,853,076 B2 | 2/2005 | Datta et al. | |
| 6,917,119 B2 | 7/2005 | Lee et al. | |
| 6,956,292 B2 | 10/2005 | Fan et al. | |
| 6,977,213 B1 | 12/2005 | Tsai et al. | |
| 7,064,436 B2 | 6/2006 | Ishiguri et al. | |
| 7,095,116 B1 * | 8/2006 | Kelkar | H01L 24/05 257/678 |
| 7,288,429 B2 | 10/2007 | Yaung et al. | |
| 7,312,535 B2 | 12/2007 | Takewaki et al. | |
| 7,348,673 B2 | 3/2008 | Kikuchi et al. | |
| 7,355,279 B2 | 4/2008 | Ke et al. | |
| 7,391,112 B2 | 6/2008 | Li et al. | |
| 7,397,121 B2 | 7/2008 | Chou et al. | |
| 7,569,475 B2 | 8/2009 | Yang et al. | |
| 7,973,418 B2 | 7/2011 | Alvarado et al. | |
| 8,072,070 B2 | 12/2011 | Lee et al. | |
| 8,072,073 B2 | 12/2011 | Kikuchi et al. | |
| 8,198,133 B2 * | 6/2012 | Daubenspeck | H01L 24/03 438/108 |
| 8,288,871 B1 * | 10/2012 | Shieh | H01L 23/49838 257/737 |
| 8,294,279 B2 | 10/2012 | Chen et al. | |
| 8,362,588 B2 | 1/2013 | Lee et al. | |
| 8,471,388 B2 | 6/2013 | Lin et al. | |
| 2001/0040290 A1 | 11/2001 | Sakurai et al. | |
| 2002/0132408 A1 | 9/2002 | Ma et al. | |
| 2005/0277283 A1 | 12/2005 | Lin et al. | |
| 2006/0220259 A1 | 10/2006 | Chen et al. | |
| 2006/0263727 A1 | 11/2006 | Lee et al. | |
| 2007/0045855 A1 | 3/2007 | Lo et al. | |
| 2007/0205520 A1 | 9/2007 | Chou et al. | |
| 2007/0232056 A1 | 10/2007 | Saitou et al. | |
| 2008/0150134 A1 | 6/2008 | Shinkai et al. | |
| 2008/0191366 A1 | 8/2008 | Hu et al. | |
| 2008/0308934 A1 | 12/2008 | Alvarado et al. | |
| 2009/0001567 A1 * | 1/2009 | Shih | H01L 24/13 257/737 |
| 2009/0194889 A1 | 8/2009 | Jeng et al. | |
| 2010/0044860 A1 | 2/2010 | Haba et al. | |
| 2010/0187687 A1 | 7/2010 | Liu et al. | |
| 2010/0244263 A1 | 9/2010 | Lin et al. | |
| 2011/0031581 A1 | 2/2011 | West | |
| 2011/0037169 A1 | 2/2011 | Pagaila | |
| 2011/0095415 A1 * | 4/2011 | Topacio | H01L 24/05 257/692 |
| 2011/0101520 A1 | 5/2011 | Liu et al. | |
| 2011/0121438 A1 | 5/2011 | Hart | |
| 2012/0049343 A1 | 3/2012 | Schulze et al. | |
| 2013/0062755 A1 | 3/2013 | Kuo et al. | |
| 2013/0147037 A1 * | 6/2013 | Shen | H01L 23/49811 257/737 |
| 2013/0299966 A1 * | 11/2013 | Kumar | H01L 24/05 257/737 |
| 2013/0320524 A1 | 12/2013 | Chuang et al. | |
| 2014/0291838 A1 | 10/2014 | Chen et al. | |
| 2015/0132941 A1 | 5/2015 | Liu et al. | |

FOREIGN PATENT DOCUMENTS

| | | |
|---|---|---|
| JP | 5335313 A | 12/1993 |
| JP | 2000228420 A | 8/2000 |
| JP | 2001257226 A | 9/2001 |
| JP | 2002313994 A | 10/2002 |
| JP | 2004296621 A | 10/2004 |
| JP | 2006032600 A | 2/2006 |
| JP | 2007258438 A | 10/2007 |
| JP | 2007273624 A | 10/2007 |
| JP | 2008016514 A | 1/2008 |
| JP | 2008182059 A | 8/2008 |
| JP | 2009071045 A | 4/2009 |
| JP | 2009188288 A | 8/2009 |
| KR | 20110051136 A | 5/2011 |
| TW | 444298 B | 7/2001 |
| TW | 200901413 | 1/2009 |

* cited by examiner

| BUMP SCHEME | $d_1$ | $d_2$ | $d_3$ | PIO | $d_5$ | CRACK COUNT |
|---|---|---|---|---|---|---|
| 45/0/0 | 74 | 65 | 9 | 45 | 8 | 74 |
| 45/0/0 | 74 | 55 | 19 | 45 | 8 | 20 |

| TV | F16 LARGE AP | F16 LARGE AP | F22 LF2 | F16 POR | F22 LF3+ | F22 LF2/65 CB2 |
|---|---|---|---|---|---|---|
| $d_1$ | 109 | 109 | 74 | 84 | 74 | 74 |
| $d_2$ | 60 | 60 | 55 | 60 | 55 | 65 |
| $d_4$ | 106 | 100 | 90 | 107 | 100 | 90 |
| $d_5$/SIDE(A) | 1.5 | 4.5 | 8 | 11.5 | 13 | 8 |
| $d_3$/SIDE(B) | 24.5 | 24.5 | 9.5 | 12 | 9.5 | 4.5 |
| A+B | 26 | 29 | 17.5 | 23.5 | 22.5 | 12.5 |
| BUMP SCHEME | 45/0/0+SAC | 45/0/0+SAC | 45/0/0+SAC | 45/0/0+SAC | 45/0/0+SAC | 45/0/0+SAC |
| PASS-2 COUNTS | 323 | 194 | 20 | 15 | 10 | 74 |

| TV | F22 LF3+ 65AP | F22 LF3+ | F22 LF3+ |
|---|---|---|---|
| $d_1$ | 65 | 74 | 74 |
| $d_2$ | 55 | 65 | 55 |
| $d_4$ | 100 | 100 | 100 |
| $d_5$ /SIDE(A) | 17.5 | 13 | 13 |
| $d_3$ /SIDE (B) | 5 | 4.5 | 9.5 |
| A+B | 22.5 | 17.5 | 22.5 |
| BUMP SCHEME | 35/0/15+SnCu | 35/0/15+SnCu | 35/0/15+SnCu |
| PASS-2 COUNTS | 2 | 20 | 2 |

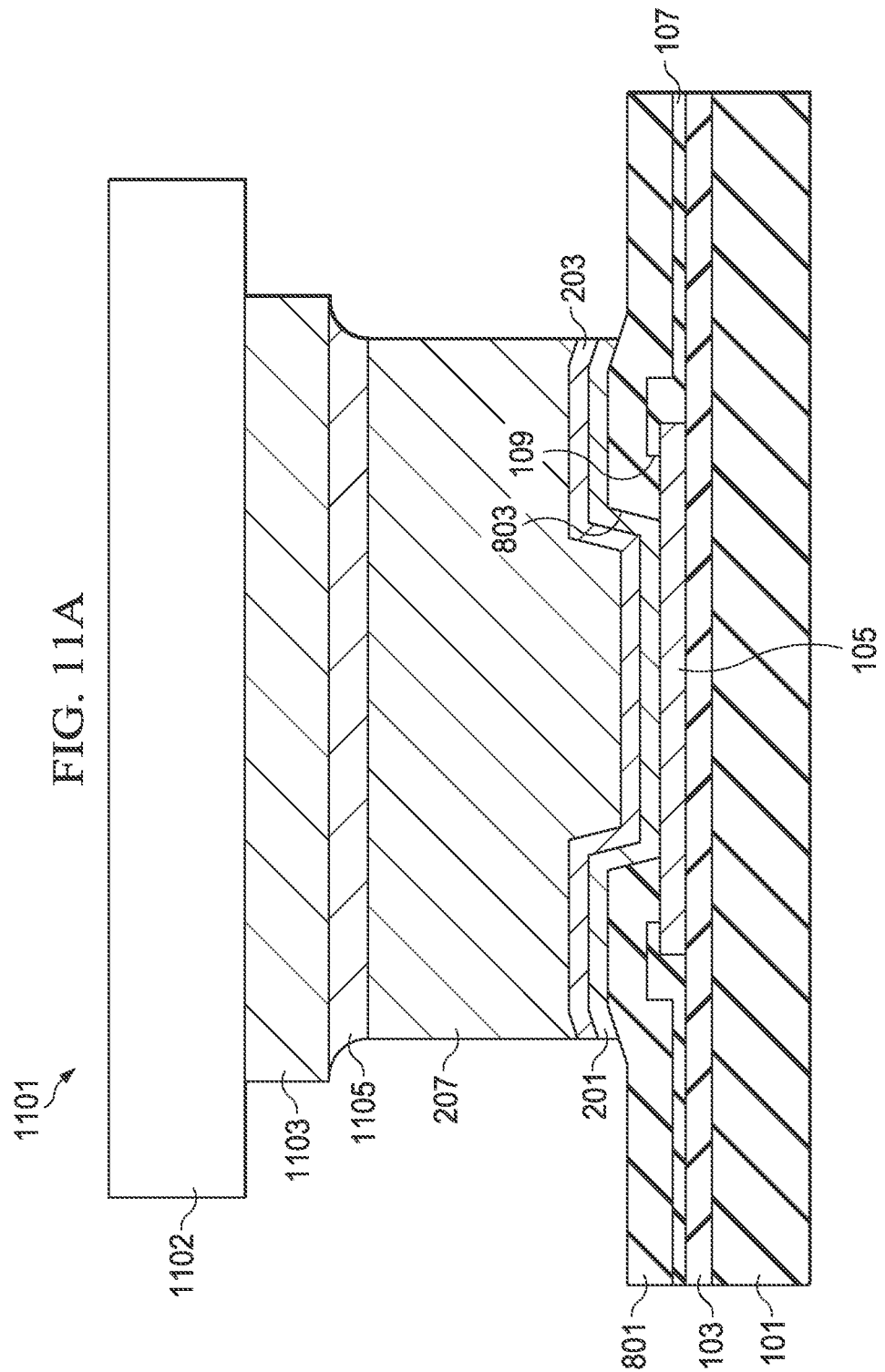

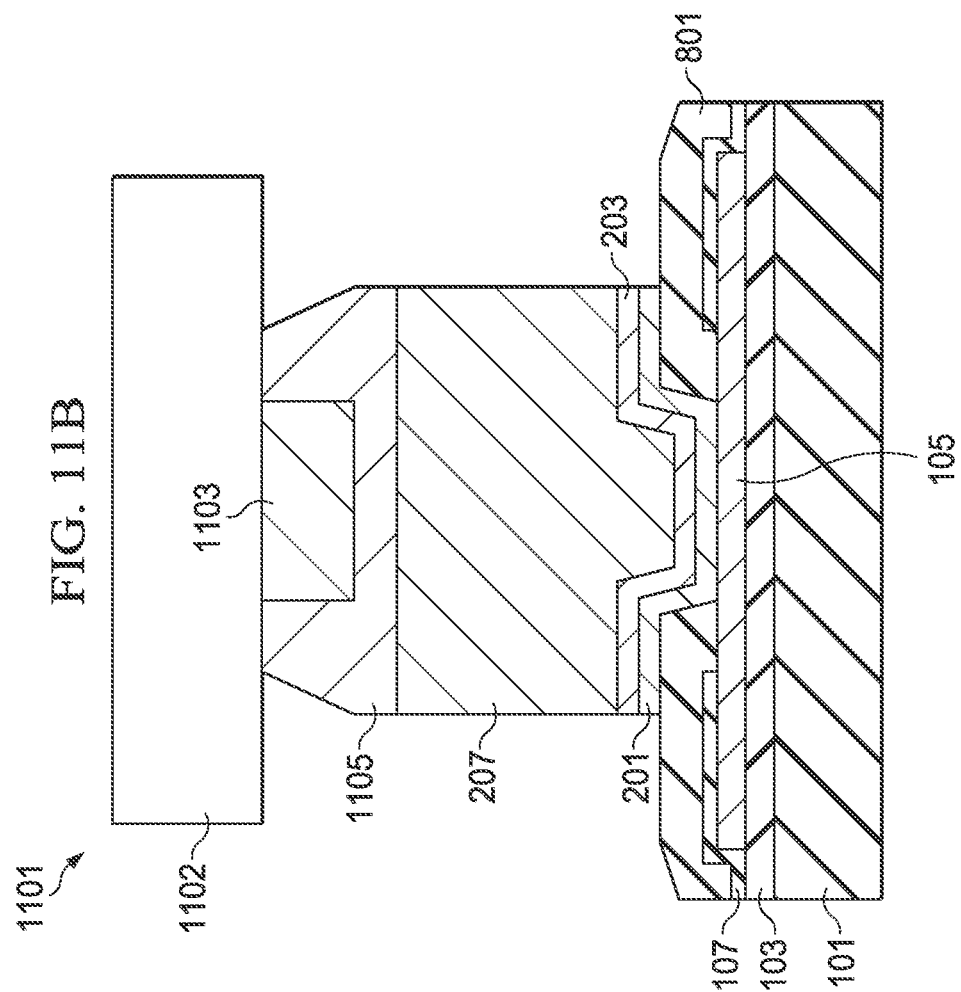

SCHEME FOR CONNECTOR SITE SPACING AND RESULTING STRUCTURES

This application is a continuation of U.S. patent application Ser. No. 14/942,756, filed on Nov. 16, 2015, entitled, "Design Scheme for Connector Site Spacing and Resulting Structures," which is a continuation of U.S. patent application Ser. No. 14/302,117, filed on Jun. 11, 2014, entitled "Design Scheme for Connector Site Spacing and Resulting Structures," now U.S. Pat. No. 9,190,348, issued on Nov. 17, 2015, which is a continuation-in-part of U.S. patent application Ser. No. 13/667,330, filed on Nov. 2, 2012, entitled "Design Scheme for Connector Site Spacing and Resulting Structures," now U.S. Pat. No. 9,472,521, issued on Oct. 18, 2016, which claims the benefit of U.S. Provisional Application No. 61/653,277 filed on May 30, 2012, entitled "Design Scheme for Connector Site Spacing and Resulting Structures," which applications are hereby incorporated herein by reference.

BACKGROUND

Generally, a semiconductor die may be connected to other devices external to the semiconductor die through a type of packaging utilizing external connections. The external connections may be formed by initially forming a layer of underbump metallization in electrical connection with a contact pad on the semiconductor die and then placing additional conductive material onto the underbump metallization. In between the underbump metallization and the contact pad may be a passivation layer that is used to protect and support the structures of the semiconductor die. Once in place, the additional conductive material may be placed into physical contact with the external device and then the semiconductor device may be bonded to the external device. In such a fashion, a physical and electrical connection may be made between the semiconductor die and an external device, such as a printed circuit board, another semiconductor die, or the like.

However, the material that comprises the underbump metallization, the passivation layer, and the contact pad are different types of materials that are formed with different processes and are manufactured on top of one another and may include very different types of materials, such as dielectric materials, metallization materials, etch stop materials, barrier layer materials, and other materials utilized in the formation of the semiconductor die. Each one of these different materials has unique properties different from each other that can cause significant stresses to be applied to the materials in each of the layers. If not controlled, these stresses can cause cracks to form, for example, within the passivation layer between the contact pad and the underbump metallization. Such cracks can damage or even destroy the semiconductor die during the manufacturing process or else during its intended use.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 11A-11B illustrate a bonding of the semiconductor device with a second semiconductor device in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figures 1A, 1B:
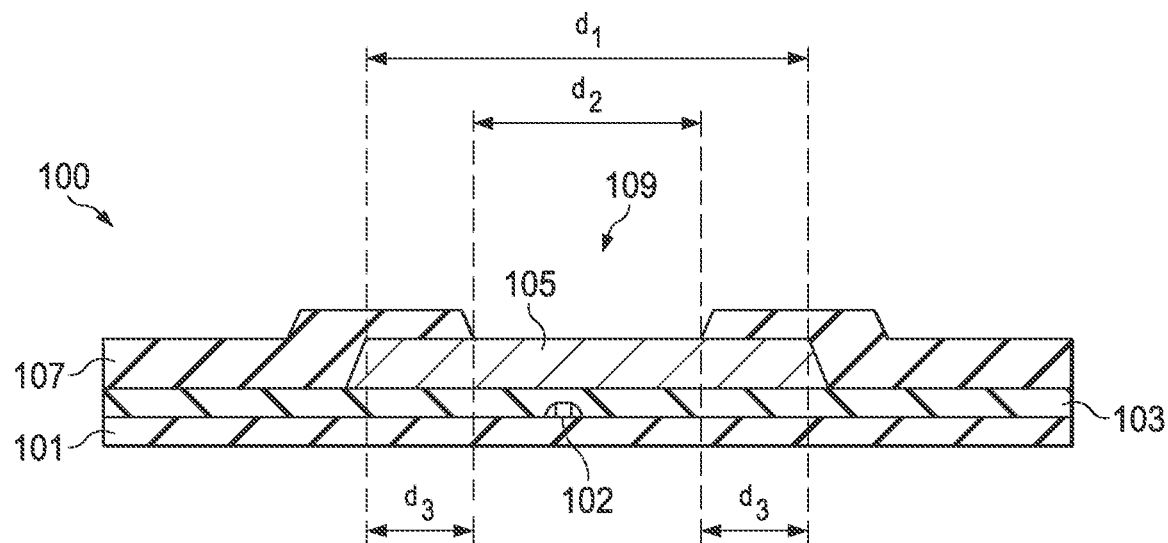
FIGS. 1A-1B illustrate a formation of a contact pad, a passivation layer, and an opening through the passivation layer in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a passivation, underbump metallization, and copper pillar formed on a contact pad. Other embodiments may also be applied, however, to other types of external contacts.

With reference now to FIG. 1, there is shown a portion of an embodiment of a semiconductor device 100. In an embodiment, the semiconductor device 100 may comprise a semiconductor substrate 101, active devices 102, metallization layers 103, a contact pad 105, and a first passivation layer 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices 102 may be formed on the semiconductor substrate 101 (represented in FIG. 1A as a single transistor). As one of ordinary skill in the art will recognize, a wide variety of active devices and passive devices such as capacitors, resistors, inductors and the like may be used to generate the desired structural and functional requirements of the design for the semiconductor device 100. The active devices 102 may be formed using any suitable methods either within or else on the surface of the semiconductor substrate 101.

However, as one of ordinary skill will recognize, the above described semiconductor substrate 101 with active devices 102 is not the only substrate that may be used. Alternative substrates, such as a package substrate or an interposer that does not have active devices therein, may alternatively be utilized. These substrates and any other suitable substrates may alternatively be used and are fully intended to be included within the scope of the present embodiments.

The metallization layers 103 are formed over the semiconductor substrate 101 and the active devices 102 and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor device 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 µm and about 4 µm, such as about 1.45 µm.

Additionally, the contact pad 105 may be formed in such a fashion as to reduce or eliminate the occurrence of cracks around the contact pad 105 within the first passivation layer 107. In particular, by manufacturing the contact pad 105 with a certain relationship of either an opening 109 through the first passivation layer 107 (discussed further below) and/or a certain relationship with the UBM layer 201 (not illustrated in FIG. 1 but illustrated and discussed further below with reference to FIGS. 2-4), the number of cracks that may form within the first passivation layer 107 may be greatly reduced or even eliminated. In an embodiment, the contact pad 105 may be formed to have a diameter that is a first distance $d_1$ of between about 35 µm and about 100 µm, such as about 74 µm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 µm and about 5 µm, such as about 9.25 KÅ.

After the first passivation layer 107 has been formed, an opening 109 may be made through the first passivation layer 107 by removing portions of the first passivation layer 107 to expose at least a portion of the underlying contact pad 105. The opening 109 allows for contact between the contact pad 105 and the UBM layer 201 (discussed further below with respect to FIG. 2). The opening 109 may be formed using a suitable photolithographic mask and etching process, although any suitable process to expose portions of the contact pad 105 may be used.

The opening may also be manufactured with a second diameter $d_2$ that will work in conjunction with the first distance $d_1$ of the contact pad 105 in order to help reduce or eliminate the occurrence of cracks within the first passivation layer 107. In an embodiment a first difference in diameters between the opening and the contact pad 105 (represented in FIG. 1 by the third distance $d_3$) may be kept greater than about 10 µm (5 µm per side), such as about 11 µm. By keeping this difference in diameters greater than about 10 µm, the stresses within the first passivation layer 107 around the contact pad 105 may be better handled without producing cracks that can damage the semiconductor device 100.

FIG. 1B illustrates a chart that illustrates this reduction in the number of cracks when only the third distance $d_3$ is increased (the fifth distance $d_5$ labeled in the chart is not illustrated in FIG. 1A, but is illustrated and discussed below with respect to FIGS. 2-4). In particular, in an embodiment in which the semiconductor device 100 has an external contact 200 (not illustrated in FIG. 1A but illustrated and discussed below with respect to FIG. 2) has a 45/0/0 bump scheme (in which the external contact 200 has a copper layer of about 45 µm and no additional layers, such as nickel layers or lead-free solder caps), and with all other variables kept constant, the second diameter $d_2$ is reduced from 65 µm to 55 µm, which also causes an increase in the third distance $d_3$ from 9 µm to 19 µm. With this increase in the third distance $d_3$, the number of cracks that occurred was reduced from 74 to 20. As such, by controlling the third distance $d_3$, the number of cracks in the first passivation layer 107 may be greatly reduced, and the overall efficiency of the semiconductor device 100 may be improved.

Figure 2:
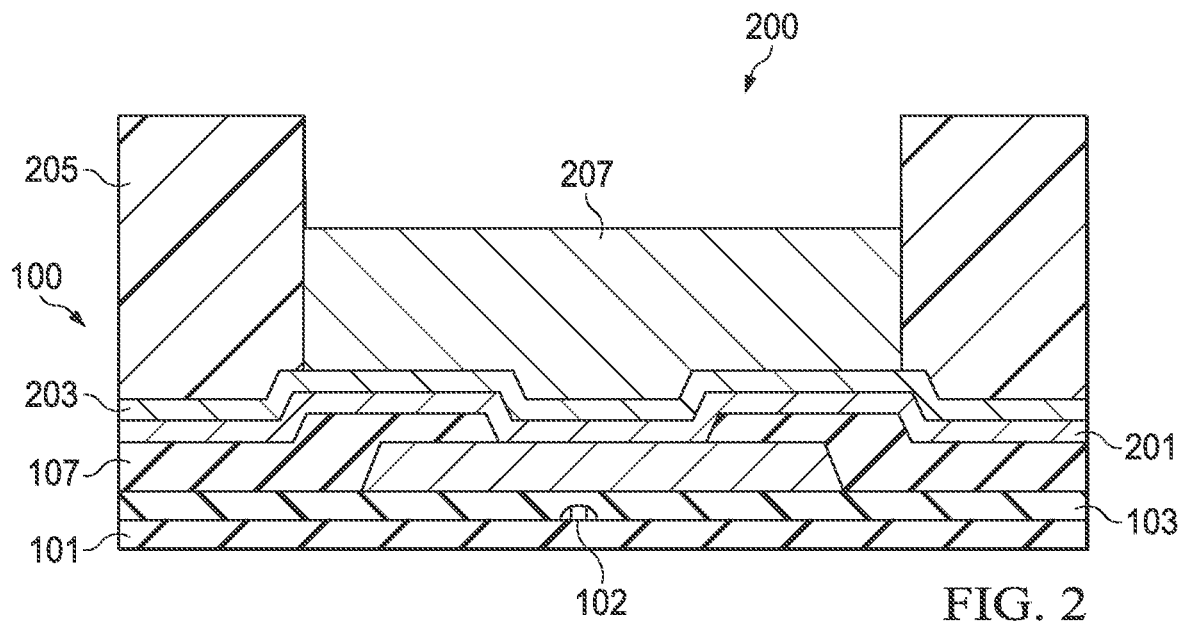
FIG. 2 illustrates a formation of an underbump metallization and an external contact in accordance with an embodiment.

FIG. 2 illustrates a formation of an external contact 200 in electrical connection with the contact pad 105 through the first passivation layer 107. In an embodiment the external contact 200 may be, e.g., a copper pillar or copper post. However, the embodiments are not limited to these, and may alternatively be solder bumps, copper bumps, or other suitable external contacts 200 that may be made to provide electrical connection from the semiconductor device 100 to other external devices (not individually illustrated in FIG. 2). All such external contacts are fully intended to be included within the scope of the embodiments.

In an embodiment in which the external contact 200 is a copper pillar, the external contact 200 may be formed by initially forming an under-bump-metallurgy (UBM) layer 201, a seed layer 203, and a polymer layer 205 with an opening. A contact 207 may be formed within the opening of the polymer layer 205. The UBM layer 201 may be formed in electrical contact with the contact pad 105. The UBM layer 201 may comprise a single layer of conductive material, such as a layer of titanium, or a layer of nickel. Alternatively, the UBM layer 201 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM layer 201. Any suitable materials or layers of material that may be used for the UBM layer 201 are fully intended to be included within the scope of the current embodiments. The UBM layer 201 may be created using processes such as sputtering, evaporation, or PECVD process, depending upon the desired materials. The UBM layer 201 may be formed to have a thickness of between about 0.7 µm and about 10 µm, such as about 5 µm.

The seed layer 203 may be formed in electrical contact with the UBM layer 201 on top of the contact pad 105. The seed layer 203 is a thin layer of a conductive material that aids in the formation of a thicker layer during subsequent processing steps. The seed layer 203 may comprise a layer of titanium about 1,000 Å thick followed by a layer of copper about 5,000 Å thick, which will be further used to connect to the contact 207. The seed layer 203 may be created using processes, such as sputtering, evaporation, or PECVD processes, depending upon the desired materials. The seed layer 203 may be formed to have a thickness of between about 0.7 µm and about 10 µm, such as about 5 µm.

The polymer layer 205 may be formed by coating on the seed layer 203. The polymer layer 205 may comprise benzene-based polymers, dioxane-based polymers, toluene-based polymers, phenylthiol-based polymers, phenol-based polymers, cyclohexane-based polymers, p-cresol-based polymers, combinations of these and the like. The formation methods include spin coating or other commonly used methods. The thickness of the polymer layer 205 may be between about 5 µm and about 30 µm. An opening of the polymer layer 205 may be formed using photolithography techniques to expose a portion of the seed layer 203 where the contact 207 will be formed.

The contact 207 comprises one or more conductive materials, such as copper, tungsten, other conductive metals, or the like, and may be formed, for example, by electroplating, electroless plating, or the like. In an embodiment, an electroplating process is used wherein the semiconductor device 100 is submerged or immersed in an electroplating solution. The semiconductor device 100 surface is electrically connected to the negative side of an external DC power supply such that the semiconductor device 100 functions as the cathode in the electroplating process. A solid conductive anode, such as a copper anode, is also immersed in the solution and is attached to the positive side of the power supply. The atoms from the anode are dissolved into the solution, from which the cathode, e.g., the semiconductor device 100, acquires the dissolved atoms, thereby plating the exposed conductive areas of the semiconductor device 100, e.g., the exposed portions of the seed layer 203 within the opening of the polymer layer 205.

Figure 3:
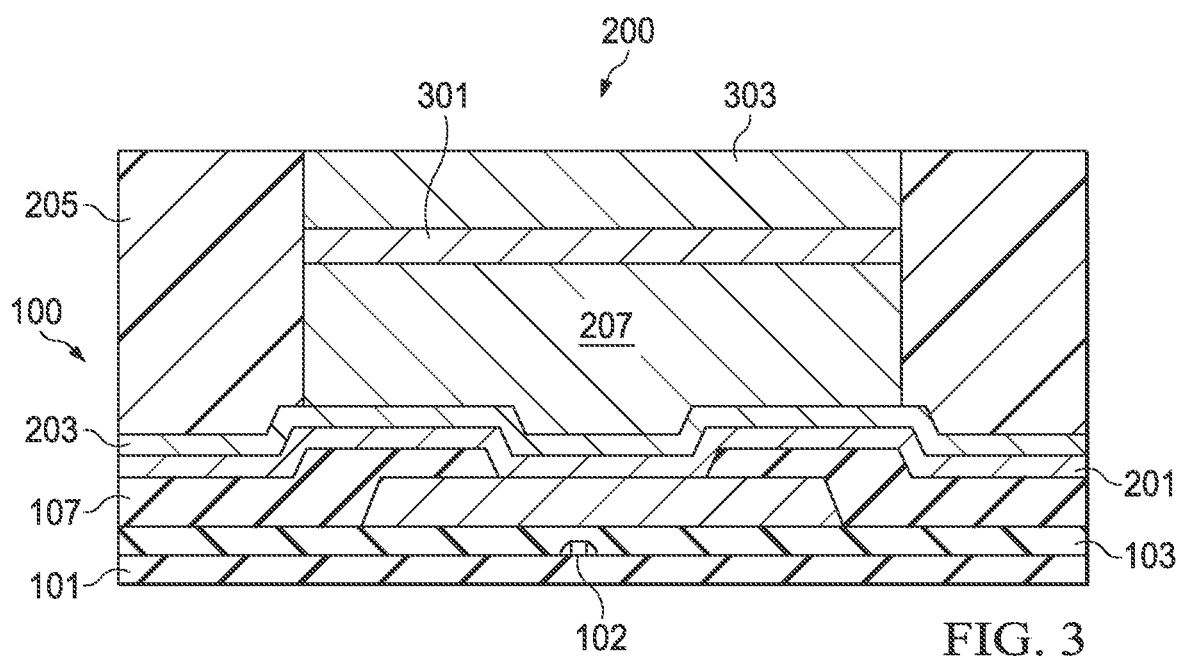
FIG. 3 illustrates a formation of a first cap layer and a second cap layer in accordance with an embodiment.

FIG. 3 illustrates a formation of a first cap layer 301 and a second cap layer 303 on the contact 207. In an embodiment the first cap layer 301 may be formed over the contact 207. For example, in an embodiment in which the contact 207 is formed of copper, the first cap layer 301 may be formed of nickel, although other materials, such as Pt, Au, Ag, Ni, Co, V, Cr, Sn, Pd, Bi, Cd, Zn, combinations thereof, or the like, may also be used. The first cap layer 301 may be formed through any number of suitable techniques, including PVD, CVD, ECD, MBE, ALD, electroplating, and the like.

The second cap layer 303 may be formed on the first cap layer 301. The second cap layer 303 may be of solder materials comprising SnAu, SnPb, a high-Pb material, a Sn-based solder, a lead-free solder, a SnAg solder, a SnAgCu solder, or other suitable conductive material. The second cap layer 303 may be formed through any number of suitable techniques, including PVD, CVD, ECD, MBE, ALD, electroplating, and the like.

The number of layers on the contact 207, such as the first cap layer 301 and the second cap layer 303, is for illustration purposes only and is not limiting. There may be a different number of layers formed on the contact 207. The various layers on the contact 207 may be formed with different materials, of various shapes. The contact 207, the first cap layer 301, and the second cap layer 303 may collectively be called a metal contact 120.

Figure 4:
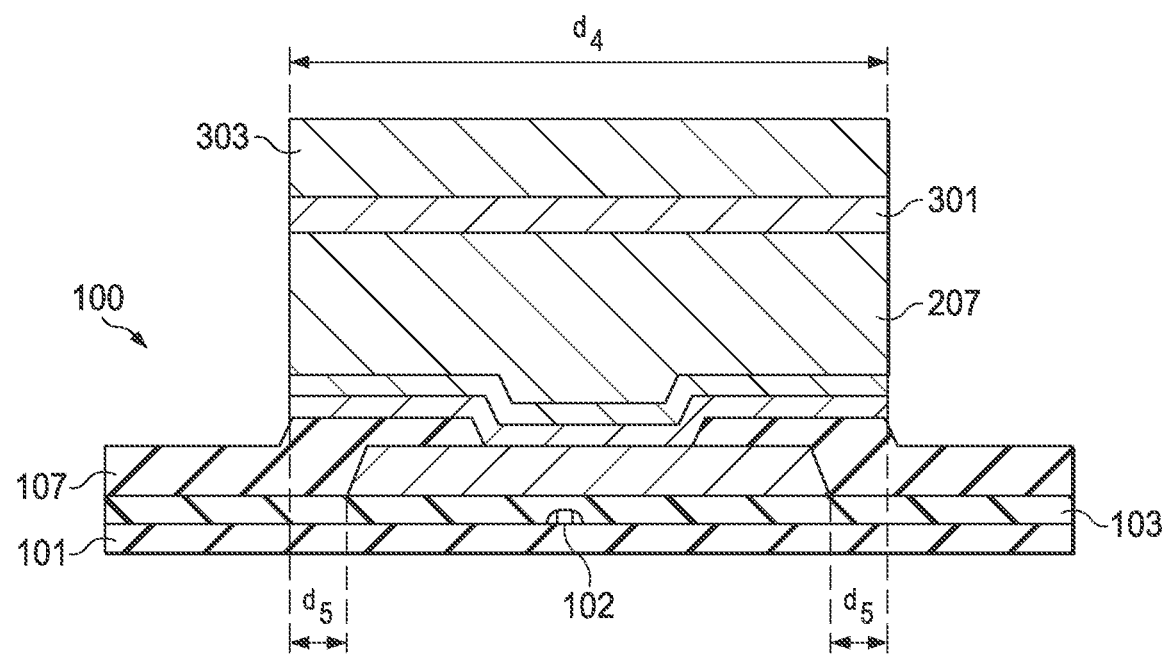
FIG. 4 illustrates a patterning of the underbump metallization layer in accordance with an embodiment.

FIG. 4 illustrates a removal of the polymer layer 205 and a patterning of the seed layer 203 and the UBM layer 201. In an embodiment, a plasma ashing process may be used to remove the polymer layer 205, whereby the temperature of the polymer layer 205 may be increased until the polymer layer 205 experiences a thermal decomposition and may be removed. However, any other suitable process, such as a wet strip, may alternatively be utilized. The removal of the polymer layer 205 may expose the underlying portions of the seed layer 203.

Exposed portions of the seed layer 203 may be removed by, for example, a wet or dry etching process. For example, in a dry etching process reactants may be directed towards the seed layer 203, using the first cap layer 301 and the second cap layer 303 as masks. Alternatively, etchants may be sprayed or otherwise put into contact with the seed layer 203 in order to remove the exposed portions of the seed layer 203. After the exposed portion of the seed layer 203 has been etched away, a portion of the UBM layer 201 will be exposed.

The exposed portions of the UBM layer 201 may then be removed by, for example, a dry etching process. The dry etching may be done using chemicals such as, $CF_4$, or $CHF_3$. Any existing etching technology or future developed etching technology may be used. After the UBM layer 109 has been etched away, a portion of the first passivation layer 107 will be exposed.

Once the exposed portions of the UBM layer 201 have been removed, the UBM layer 201 may have a fourth diameter $d_4$, which may be used in conjunction with the first diameter $d_1$ of the contact pad 105 in order to help reduce or eliminate cracks that can form within the first passivation layer 107. In particular, a second difference in diameters between the UBM layer 201 and the contact pad 105 (represented in FIG. 4 by a fifth distance $d_5$) may be kept at a certain range or ratio in order to help prevent cracks from forming within the first passivation layer 107.

Figure 5:
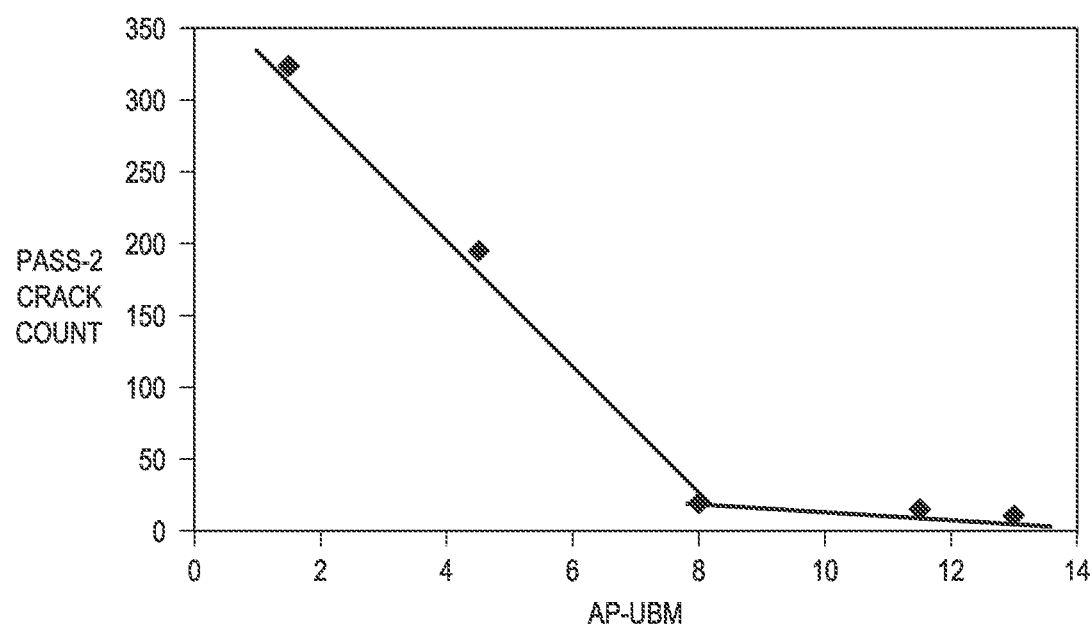
FIG. 5 illustrates experimental data of the benefits of embodiments.

For example, FIG. 5 illustrates resulting numbers of cracks that occur in the first passivation layer 107 at difference values of the fifth distance $d_5$. As can clearly be seen, there are a large number of cracks that will form within the first passivation layer 107 when the fifth distance $d_5$ is below about 8 µm. However, the number of cracks in the first passivation layer 107 is greatly reduced when the fifth distance $d_5$ is greater than about 5 µm, and will saturate with a reduced number of cracks at about 10 µm or greater. By reducing the number of cracks, the dependability of the overall semiconductor device 100 may be improved, thereby improving performances as well as yields.

In another embodiment, in addition to simply modifying the third distance $d_3$ (as described above with respect to FIGS. 1A-1B), or simply modifying the fifth distance $d_5$ (as described above with respect to FIGS. 4-5), both the third distance d3 and the fifth distance $d_5$ may be modified at the same time in order to produce even greater results. For example, in an embodiment the third distance $d_3$ may be kept greater than 10 µm while the fifth distance $d_5$ may be kept greater than about 5 µm. Additionally, a sum of the third distance $d_3$ and the fifth distance $d_5$ ($d_3+d_5$) may be kept greater than about 15 µm.

Figures 6A, 6B:
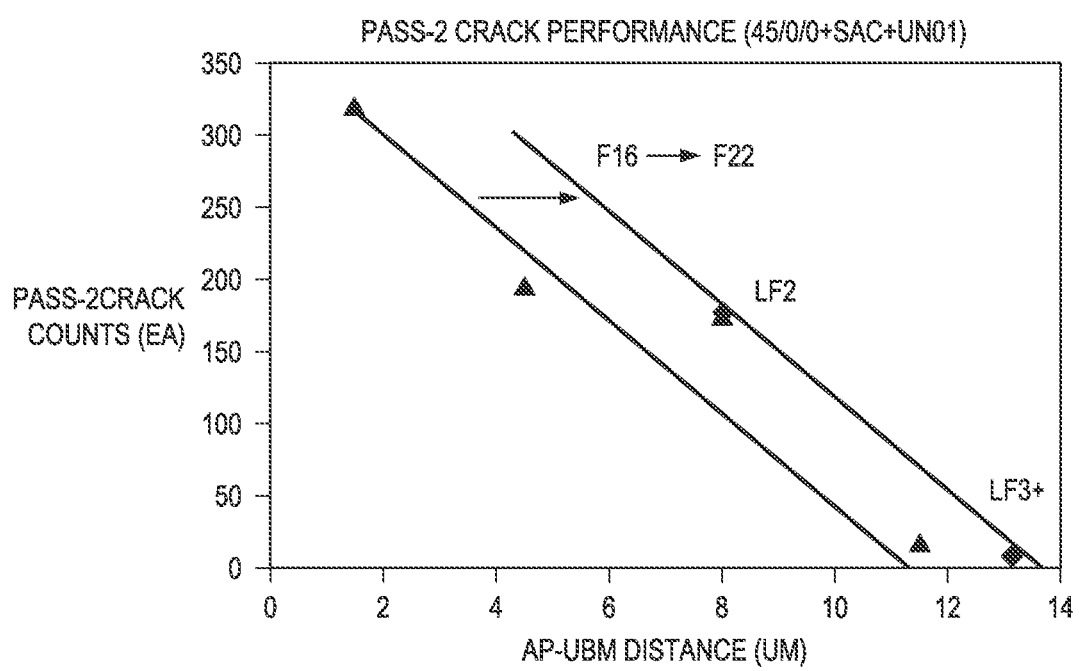
FIGS. 6A-6C illustrate further experimental data in accordance with embodiments.

FIGS. 6A-6B illustrate comparative results of the combined modifications of the third distance $d_3$ and the fifth distance $d_5$. For example, in FIG. 6A, for a embodiment in which the bump scheme is 45/0/0 (similar to FIG. 1B above) and is bonded to, e.g., a sacrificial layer that may comprise Sn, Ag, and/or Cu, the number of cracks in the first passivation layer 107 may be reduced to below 20 with a third distance $d_3$ of 24 µm (12 µm per side of the third distance $d_3$) and a fifth distance $d_5$ of 24 µm (11.5 µm/side), for a combined sum of 47 µm (23.5 µm/side).

FIG. 6B illustrates the results of the table illustrated in FIG. 6A in graphical format. As can be seen, by also controlling the third distance $d_3$ in addition to the fifth distance $d_5$, the number of cracks may be reduced within the first passivation layer 107.

Figures 6C, 7:
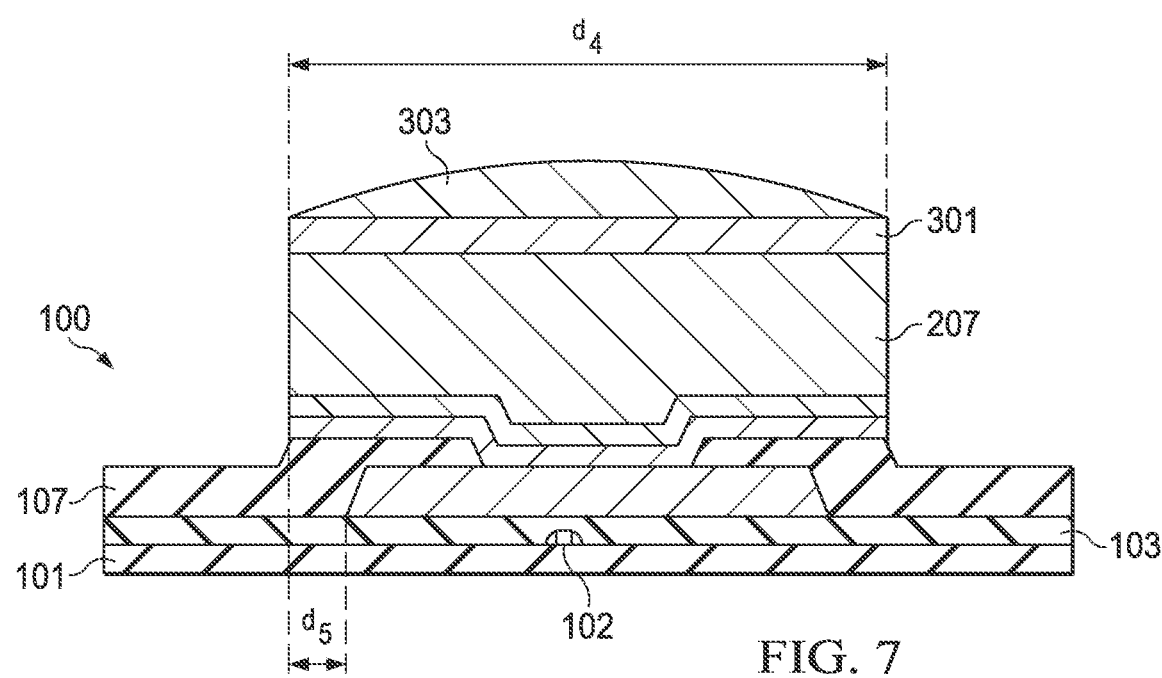
FIG. 7 illustrates a reflow process in accordance with an embodiment.

FIG. 6C illustrates another table of results for a separate bump scheme in which the external contact 200 has a 35/0/15+SnCu bump scheme. For example, the external contact 200 may have a copper layer of about 35 µm with a SnAg layer of about 15 µm over the copper layer. A SnCu cap may be used over the SnAg, and the SnCu cap may comprise about 98.2% Sn and about 1.8% Cu. As can be seen, by keeping the third distance $d_3$ greater than 10 µm (5 µm/side) and by keeping the fifth distance $d_5$ greater than 5 µm (2.5 µm/side), the number of cracks within the first passivation layer 107 may be kept to a small number. However, if these ratios are not used, for example if the third distance $d_3$ is below 10 µm (5 µm/side) such as 9 µm (4.5 µm/side), the number of cracks that can occur within the first passivation layer 107 can jump to a larger number.

FIG. 7 illustrates that, once the second cap layer 303 has been formed on the first cap layer 301 and the exposed portions of the UBM layer 201 have been removed, a reflow process may be performed to transform the second cap layer 303 into a bump shape. In the reflow process the temperature of the second cap layer 303 is raised to between about 200° C. and about 260° C., such as about 250° C., for between about 10 seconds and about 60 seconds, such as about 35 seconds. This reflow process partially liquefies the second cap layer 303, which then pulls itself into the desired bump shape due to the second cap layer's 303 surface tension.

By manufacturing the contact pad 105, the opening through the first passivation layer 107, and the UBM layer 201 within the relationships described herein, the number of cracks that form within the first passivation layer 107 may be reduced or eliminated. By reducing the number of undesirable cracks within the first passivation layer 107, the protection afforded by the first passivation layer 107 may be maintained during further processing and usage of the semiconductor device 100. Such protection increase the overall efficiency of the manufacturing process and lead to greater yields and better improvement for each semiconductor device.

Figure 8A:
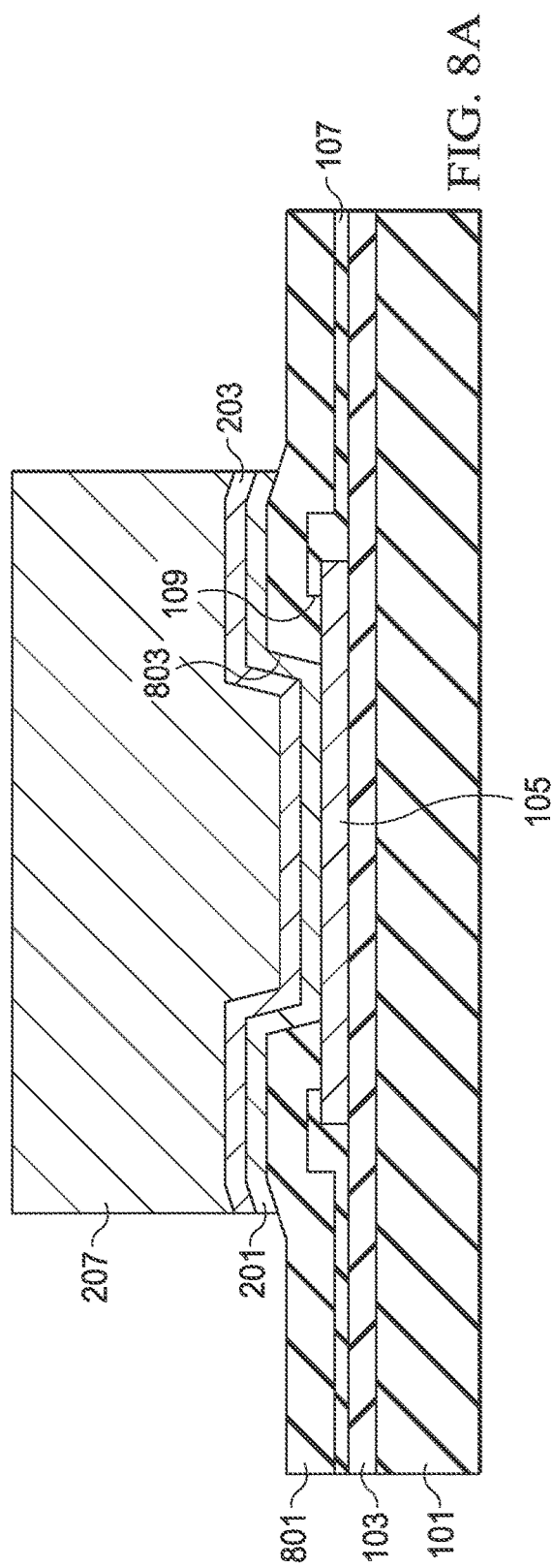
FIGS. 8A-8C illustrates a contact pad and underbump metallization in accordance with an embodiment.
Figure 8C:
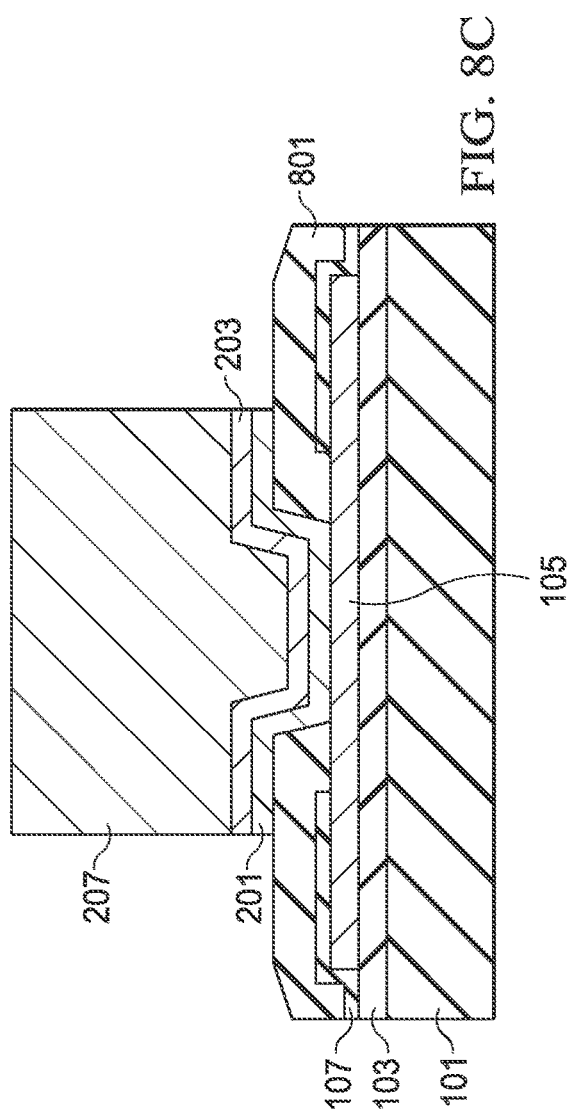
Figure 8B:
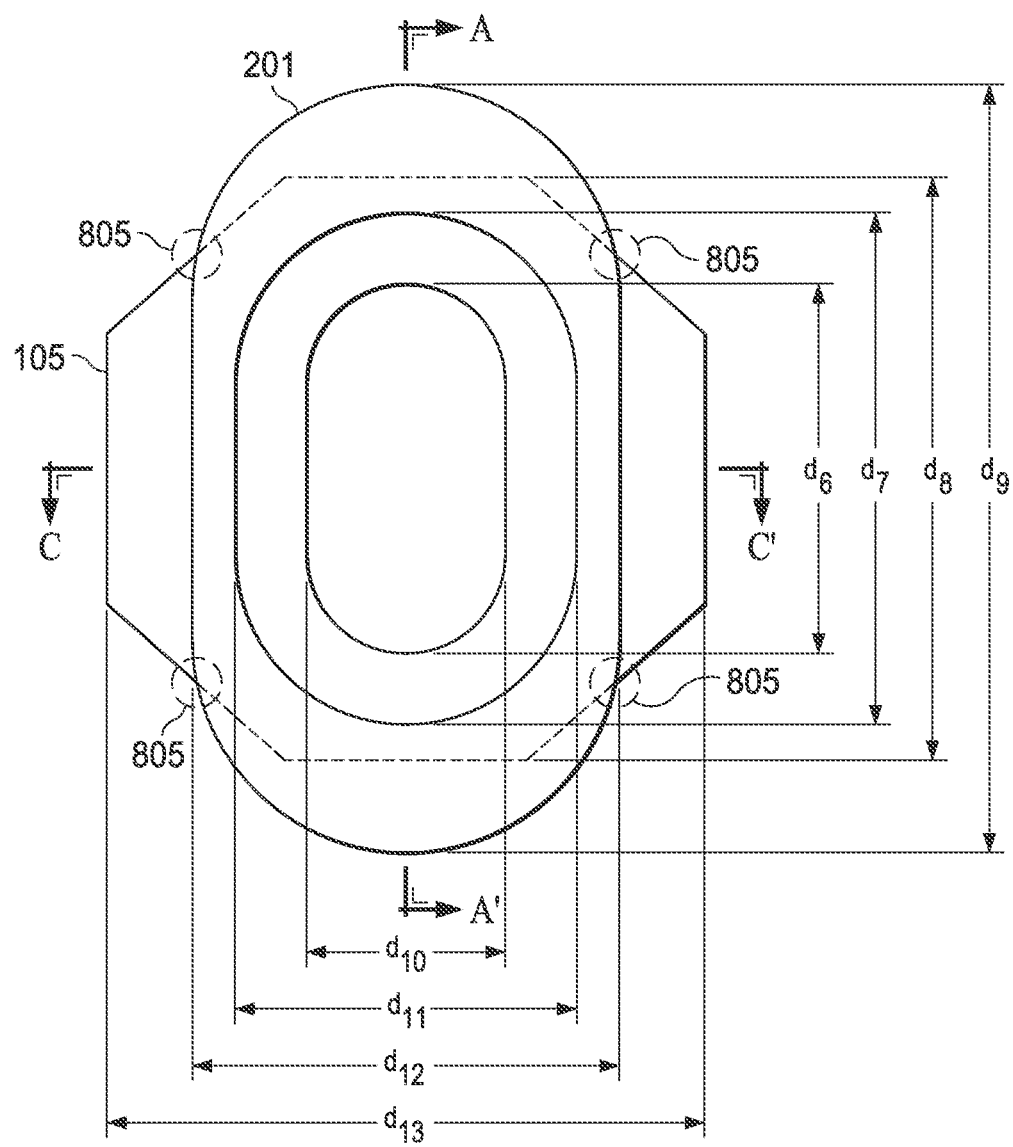

FIGS. 8A-8C illustrate two cross-sectional views (FIGS. 8A and 8C) along with a top down view (FIG. 8B) of another embodiment. Looking first at FIG. 8A, in this embodiment the semiconductor device 100 has the contact pad 105, the first passivation layer 107, the seed layer 203, the UBM layer 201, and the contact 207. These elements may be formed using materials and processes as described above with respect to FIGS. 1-4, although other suitable elements may alternatively be utilized as well.

Additionally in this embodiment, a second passivation layer 801 is formed over the first passivation layer 107 and prior to the formation of the UBM layer 201. In an embodiment the second passivation layer 801 may be formed from a polymer such as polyimide. Alternatively, the second passivation layer 801 may be formed of a material similar to the material used as the first passivation layer 107, such as silicon oxides, silicon nitrides, low-k dielectrics, extremely low-k dielectrics, combinations of these, and the like. The second passivation layer 801 may be formed to have a thickness between about 2 µm and about 15 µm, such as about 5 µm.

Once the second passivation layer 801 has been formed, the second passivation layer 801 may be patterned to form a second opening 803 and to expose the contact pad 105 through the second passivation layer 801 so that the UBM layer 201 may be formed in electrical connection with the contact pad 105. The second opening 803 may be formed using a suitable photolithographic mask and etching process, although any suitable process to expose portions of the contact pad 105 through the second passivation layer 801 may be used.

FIG. 8B illustrates a top down view of the contact pad 105, the UBM layer 201, the opening 109, and the second opening 803, with the line A-A' illustrating the view of FIG. 8A, and the line C-C' illustrating the view of FIG. 8C. In this embodiment the UBM layer 201 has a dimension (e.g. the ninth length $d_9$) in a first direction that is greater than a dimension (e.g., the twelfth distance $d_{12}$) in a second direction perpendicular to the first direction. As such, the UBM layer 201 is not limited to a symmetrical shape and may have an elongated shape, although any suitable shape, such as rectangular, elliptic, or oval, may alternatively be utilized.

Additionally, in an embodiment the contact pad 105 may have an eighth distance $d_8$ in the first direction and a thirteenth distance $d_{13}$ in the second direction, which may be the same or else may be different. However, at least one of either the eighth distance $d_8$ or the thirteenth distance $d_{13}$ is less than one of the UBM layer's 201 ninth distance $d_9$ or twelfth distance $d_{12}$. Additionally, the other one (the one that is not less than one of the UBM layer's 201 ninth distance $d_9$ or twelfth distance $d_{12}$) of either the eighth distance $d_8$ or the thirteenth distance $d_{13}$ is less than the other one of the ninth distance $d_9$ or the twelfth distance $d_{12}$. As such, from the top down view illustrated in FIG. 8B, the contact pad 105 has a perimeter that passes underneath and intersect a perimeter of the UBM layer 201 at least four points (represented in FIG. 8B by the dashed circles labeled 805).

Additionally, while the contact pad 105 is illustrated in FIG. 8B as being octagonal, this is only intended to be illustrative and is not intended to be limiting. Rather, the contact pad 105 may be any suitable shape, such as round, oval, or any other suitable shape. All such shapes are fully intended to be included within the scope of the embodiments.

In a particular embodiment (illustrated in FIG. 8B) in which the contact pad 109 has the eighth distance $d_8$ equal to the thirteenth distance $d_{13}$, the UBM layer 201 may have the ninth distance $d_9$ larger than the eighth distance $d_8$ and may also have the twelfth distance $d_{12}$ that is less than the thirteenth distance $d_{13}$. For example, in an embodiment in which adjacent contacts 207 have a pitch $P_1$ (not illustrated in FIGS. 8A-8C but illustrated and described below with respect to FIG. 9) of about 80 µm, the eighth distance $d_8$ and the thirteenth distance $d_{13}$ are both about 45 µm and the UBM layer 201 may have the ninth distance $d_9$ that is about 63 µm and the twelfth distance $d_{12}$ that is about 30 µm.

Additionally within FIG. 8B, the opening 109 (through the first passivation layer 107) and the second opening 803 (through the second passivation layer 801) may be formed in order to assist with the stresses that the elongated UBM layer 201 and its associated contact pad 105 may generate. In an embodiment the opening 109 may be formed in an elongated shape (similar to the UBM layer 201), with a seventh distance $d_7$ in the first direction of between about 30 µm and about 40 µm and an eleventh distance $d_{11}$ in the second direction of between about 16 µm and about 30 µm. Continuing the embodiment discussed above wherein adjacent contacts 207 have the pitch $P_1$ of about 80 µm, the seventh distance $d_7$ is about 30 µm and the eleventh distance $d_{11}$ is about 16 µm.

The second opening 803 (through the second passivation layer 801) may also have an elongated shape, such as the oval shape illustrated in FIG. 8B. In an embodiment the second opening 803 may be formed to have a sixth distance $d_6$ in the first direction of between about 15 µm and about 40 µm, such as about 20 µm, and a tenth distance $d_{10}$ in the second direction of between about 8 µm and about 20 µm, such as about 10 µm. Continuing the embodiment discussed above wherein adjacent contacts 207 have the pitch $P_1$ of about 80 µm, the sixth distance $d_6$ is about 20 µm and the tenth distance $d_{10}$ is about 10 µm.

FIG. 8C illustrates the cross-sectional view of FIG. 8B along the dashed line C-C'. As illustrated, the twelfth distance $d_{12}$ (of the UBM layer 201) is less than the thirteenth distance $d_{13}$ (of the contact pad 105). This allows the UBM layer 201 to be reduced in size in this cross-section as compared to the cross-section illustrated in FIG. 8A, while still retaining the connectivity between the UBM layer 201 and the contact pad 105. This allows the contact pad 105 itself to be reduced in size without a significant deterioration in performance.

Figure 9:
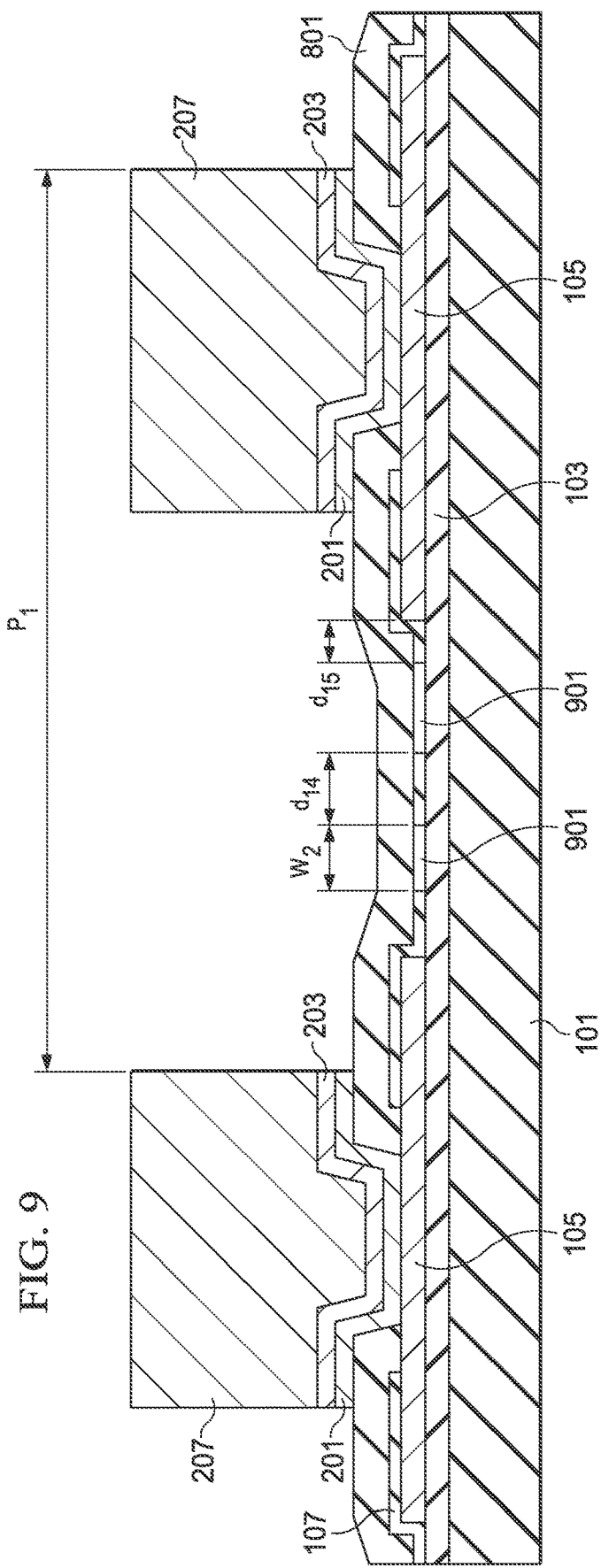
FIG. 9 illustrates two contact pads along with additional redistribution lines in accordance with an embodiment.

FIG. 9 illustrates an expanded view of the semiconductor device and illustrates one of the benefits of the embodiments as described above with respect to FIGS. 8A-8C. In this embodiment, with the dimensions of the contact pad 105 being such that the UBM layer 201 has at least one dimension greater and one dimension less than the contact pad 105, additional space between adjacent contacts 207 may be achieved. Within this space, two or more redistribution lines 901 (within, e.g., a redistribution layer) may be placed between adjacent contacts 207, allowing for greater flexibility for routing.

In an embodiment the redistribution lines 901 may be within the first passivation layer 107. The redistribution lines 901 may be utilized as a redistribution layer to route electrical signals, power and ground around the semiconductor device 100. In an embodiment the redistribution lines 901 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the redistribution lines 901 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD followed by a subtractive etching process, may alternatively be used to form the redistribution lines 901.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

However, as one or ordinary skill in the art will recognize, the above described process for forming the redistribution lines 901 is only intended to be illustrative and is not intended to be limiting upon the embodiments. Rather, any suitable process for forming the redistribution lines 901, such as by forming it concurrently with the contact pads 105 using the same materials and processes, may alternatively be utilized. Any suitable process may be utilized, and all such processes are fully intended to be included within the scope of the embodiments.

In the particular embodiment discussed above in which the pitch $P_1$ between a first one of the contacts 207 and a second one of the contacts 207 is about 80 µm, the eighth distance $d_8$ and the thirteenth distance $d_{13}$ (see FIG. 8B) is 45 µm, the twelfth distance $d_{12}$ is 30 µm, and the ninth distance $d_9$ is 60 µm, two redistribution lines 901 may be placed between adjacent contacts 105. In such an embodiment the two redistribution lines 901 may each have a second width $W_2$ of between about 2 µm and about 14.5 µm, such as about 10 µm, may be separated from each other by a fourteenth distance $d_{14}$ of between about 2 µm and about 10.3 µm, such as about 5 µm, and may be separated from the contact pads 105 by a fifteenth distance $d_{15}$ of between about 2 µm and about 10.3 µm, such as about 5 µm.

By utilizing the embodiments described herein, the old design theorem that the contact pad has to be greater than the size of the UBM layer 201 underneath it does not need to be followed. As such, the flexibility of the design for the contact pad 105 and the redistribution lines 901 is increased. This is especially useful in flip chip designs or wafer level chip scale package (WLCSP) designs, which utilize higher I/O numbers and finer pitches.

Figure 10:
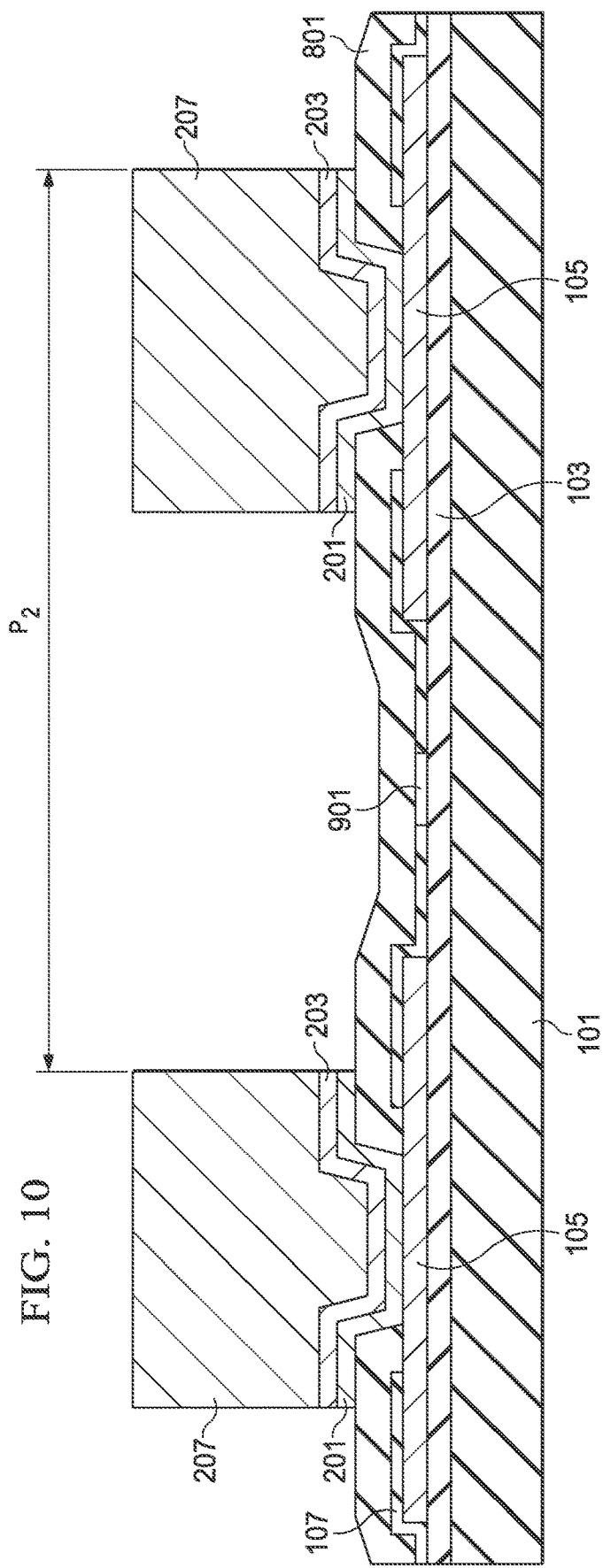
FIG. 10 illustrates two contact pads with a single redistribution line in accordance with an embodiment.

FIG. 10 illustrates another embodiment in which a single redistribution line 901 is desired between the adjacent contacts 105. In this embodiment, rather than adding additional ones of the redistribution lines 901, the pitch between the contacts 207 may be reduced from the first pitch P1 (illustrated above with respect to FIG. 9). For example, in an embodiment in which the eighth distance $d_8$ and the thirteenth distance $d_{13}$ (see FIG. 8B) are 35 µm, the twelfth distance $d_{12}$ is 20 µm, and the ninth distance $d_9$ is 40 µm, the pitch between adjacent ones of the contacts 207 may be reduced below 80 µm, such as by being a second pitch $P_2$ of between about 41 µm and about 75 µm, such as about 60 µm. By lowering the pitch from the first pitch $P_1$ to the second pitch $P_2$ between adjacent ones of the contacts 207, a greater number of contacts 207 can be formed within a similar area, allowing a larger number of I/O contacts to be formed on the semiconductor device 100, or allowing the semiconductor device 100 to reduce its size while maintaining a similar number of I/O contacts.

FIGS. 11A-11B illustrate a bonding of the contact 207 to a second semiconductor device 1101 in e.g., a flip chip or wafer level chip scale package configuration utilizing a bump on trace (BOT) bonding configuration. In an embodiment the second semiconductor device 1101 may comprise a second substrate 1102 such as, e.g., a printed circuit board, a packaging substrate, or an interposer to which the semiconductor device 100 may be attached such that signals and/or power connections may be shared between the semiconductor device 100 and the second semiconductor device 1101. However, any other suitable connection to which the semiconductor device 100 may be attached may alternatively be utilized.

The second semiconductor device 1101 comprises an external connection 1103 to make electrical contact with the contact 207. In an embodiment the external connection 1103 may be an electrical trace of conductive material on the surface of the second semiconductor device 1101. For example, the external connection 1103 may be copper or aluminum formed and patterned using a process such as deposition and subtractive etching; masking and plating; or the like, depending upon the material chosen. However, any suitable configuration, such as a copper/solder/eutectic configuration or any other suitable connecting materials may alternatively be utilized.

To bond the semiconductor device 100 to the second semiconductor device 1101, a second external connection 1105 (not separately illustrated in FIGS. 11A-11B) may initially be formed on the contact 207. In an embodiment the second external connection 1105 may be similar to the second cap layer 303 (described above with respect to FIG. 3). For example, the second external connection 1105 may be of solder materials comprising SnAu, SnPb, a high-Pb material, a Sn-based solder, a lead-free solder, a SnAg solder, a SnAgCu solder, or other suitable conductive material, and may be formed through any number of suitable techniques, including PVD, CVD, ECD, MBE, ALD, electroplating, and the like. Once the second external connection 1105 has been formed, a reflow process may be performed to transform the second external connection 1105 into a bump shape. In the reflow process the temperature of the second external connection 1105 is raised to between about 200° C. and about 260° C., such as about 250° C., for between about 10 seconds and about 60 seconds, such as about 35 seconds. This reflow process partially liquefies the second external connection 1105, which then pulls itself into the desired bump shape due to the second external connection's 1105 surface tension.

Once the second external connection 1105 has been formed, the second external connection 1105 may be used to bond the semiconductor device 100 to the second semiconductor device 1101. In an embodiment the bonding may be performed by placing the second external connection 1105 into physical contact with the external connection 1103 (e.g., the trace), and a reflow process is performed while the external connection 1103 is in contact with the second external connection 1105. The reflow process will partially liquefy the second external connection 1105, allowing it to flow over and bond with the external connection 1103. Once cooled, the second external connection 1105 will have electrically and physically connected the semiconductor device 100 to the second semiconductor device 1101.

FIG. 11B illustrates another cross-sectional view from the view in FIG. 11A. In this figure, the bonding of the second external connection 1105 to the external connection 1103 is readily seen, as the UBM layer 201 (and, thus, the contact 207) has a smaller cross-section. As such, the second external connection 1105 connects to multiple sides of the external connection 1103.

In an embodiment, a semiconductor device comprising a contact pad with a first diameter and an underbump metallization in electrical connection with the contact pad is provided. The underbump metallization has a second diameter, wherein the second diameter is greater than the first diameter by a first distance of about 10 µm.

In yet another embodiment, a semiconductor device comprising a contact pad on a substrate, the contact pad comprising a first dimension, is provided. A passivation layer is at least partially over the contact pad, and an opening is through the passivation layer, the opening comprising a second dimension. An underbump metallization extends through the opening to contact the contact pad, the underbump metallization comprising a third dimension, wherein the third dimension is greater than the first dimension by a first value of greater than about 5 µm.

In yet another embodiment, a method of manufacturing a semiconductor device comprising forming a contact pad on a substrate, the contact pad comprising a first diameter, is provided. A passivation layer is deposited over the contact pad, and the passivation layer is patterned to form an opening through the passivation layer, the opening having a second diameter smaller than the first diameter. An underbump metallization is formed to extend through the opening, the underbump metallization having a third diameter greater than the first diameter by a first distance greater than about 5 µm.

In yet another embodiment, a semiconductor device comprising a first contact pad over a substrate, wherein the first contact pad has a first dimension and a second dimension perpendicular to the first dimension, the first dimension and the second dimension being parallel with a major surface of the substrate is provided. An underbump metallization is over the first contact pad, wherein the underbump metallization has a third dimension and a fourth dimension perpendicular to the third dimension, wherein the third dimension is less than the first dimension and the fourth dimension is greater than the second dimension.

In yet another embodiment, a semiconductor device comprising a first contact pad over a substrate, wherein the first contact pad has a first perimeter is provided. An underbump metallization is in electrical connection with the first contact pad, wherein the underbump metallization has a second perimeter, and wherein the first perimeter and the second perimeter overlap each other more than once.

In yet another embodiment, a method of manufacturing a semiconductor device comprising forming a first contact pad on a substrate, the first contact pad being formed with a first dimension parallel with a major surface of the substrate and a second dimension perpendicular with the first dimension and parallel with the major surface of the substrate is provided. An underbump metallization is formed in electrical connection with the first contact pad, the underbump metallization having a third dimension parallel with but shorter than the first dimension and having a fourth dimension parallel with but longer than the second dimension.

Although the present embodiments and their advantages have been described in detail, it should be understood that various changes, substitutions and alterations can be made herein without departing from the spirit and scope of the disclosure as defined by the appended claims. For example, the type of external contact may be modified, or the precise materials and processes used may be changed, while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising: a first contact pad over a substrate, the first contact pad having a first symmetrical perimeter; and a first underbump metallization over and in physical contact with the first contact pad, wherein the first contact pad is located between the substrate and the first underbump metallization, the first underbump metallization having an elongated perimeter, the elongated perimeter having a first line of symmetry and a second line of symmetry, the elongated perimeter having a first width along the first line of symmetry and a second width along the second line of symmetry, the second width being different from the first width, the second line of symmetry being perpendicular to the first line of symmetry in a plan view, the elongated perimeter being located within the bounds of the first symmetrical perimeter along the first line of symmetry, the elongated perimeter extending outside the bounds of the first symmetrical perimeter along the second line of symmetry.

2. The semiconductor device of claim 1, further comprising:
    a second contact pad over the substrate, the second contact pad having a second symmetrical perimeter; and
    a second underbump metallization in physical contact with the second contact pad, the second underbump metallization having a perimeter being directly over the second symmetrical perimeter at least once in a top down view.

3. The semiconductor device of claim 2, further comprising:
    a first external contact in connection with the first underbump metallization; and
    a second external contact in connection with the second underbump metallization.

4. The semiconductor device of claim 3, wherein a pitch between the first external contact and the second external contact is about 80 μm.

5. The semiconductor device of claim 4, further comprising:
    a first redistribution line located between the first external contact and the second external contact; and
    a second redistribution line located between the first external contact and the second external contact.

6. The semiconductor device of claim 5, wherein the first redistribution line has a width of between about 2 μm and about 14.5 μm.

7. The semiconductor device of claim 1, wherein the elongated perimeter is a rectangular perimeter.

8. A semiconductor device comprising:
    a first contact pad, the first contact pad having a first shape;
    a first passivation layer at least partially overlying the first contact pad;
    a first opening through the first passivation layer, the first opening having a second shape different from the first shape, the second shape of the first opening staying within the bounds of the first shape of the first contact pad in a top down view;
    a second passivation layer at least partially overlying the first contact pad;
    a second opening through the second passivation layer, the second opening having the second shape, the second shape of the second opening staying within the bounds of the first shape of the first contact pad in the top down view; and
    an underbump metallization extending through the first opening and the second opening to make contact with the first contact pad, the underbump metallization having the second shape, the second shape of the underbump metallization having a first portion and a second portion, the first portion and the second portion having different widths, the first portion being located within the bounds of the first shape of the first contact pad in the top down view, the second portion extending outside of the bounds of the first shape of the first contact pad in the top down view.

9. The semiconductor device of claim 8, wherein the second opening has a first dimension in a first direction, the first opening has a second dimension greater than the first dimension in the first direction, and the underbump metallization has a third dimension greater than the second dimension in the first direction.

10. The semiconductor device of claim 8, wherein the first contact pad has a first dimension in a first direction and a second dimension in a second direction perpendicular to the first direction, wherein the first dimension is equal to the second dimension.

11. The semiconductor device of claim 8, wherein the first contact pad has a first dimension in a first direction and a second dimension in a second direction perpendicular to the first direction, wherein the first dimension is different from the second dimension.

12. The semiconductor device of claim 8, wherein the underbump metallization comprises a rectangular shape.

13. The semiconductor device of claim 8, wherein the underbump metallization comprises an elliptic shape.

14. The semiconductor device of claim 8, wherein the underbump metallization comprises an oval shape.

15. A semiconductor device comprising:
    a first contact pad over a substrate, the first contact pad having a first perimeter, the first perimeter having a first width measured along a first line and the first width measured along a second line, the first line and the second line each extending through a center of the first perimeter, the first line being perpendicular to the second line in a top down view;
    a first underbump metallization extending through a passivation layer to be in physical contact with the first contact pad, the first underbump metallization having a second perimeter, the second perimeter having a second width measured along a third line and a third width measured along a fourth line, the third line and the fourth line each extending through a center of the second perimeter, the third line being perpendicular to the fourth line in the top down view, the second width being greater than the first width, the third width being less than the first width;
    a first external contact in connection with the first underbump metallization;
    a reflowable material in physical contact with the first external contact; and
    a second external contact in physical contact with the reflowable material on an opposite side of the reflowable material from the first external contact.

16. The semiconductor device of claim 15, further comprising:
    a second contact pad over the substrate, the second contact pad having a third perimeter;
    a second underbump metallization in physical contact with the second contact pad, the second underbump metallization having a fourth perimeter that crosses the third perimeter at least four times in a top down view; and a third external contact in connection with the second underbump metallization.

17. The semiconductor device of claim 16, wherein a pitch between the first external contact and the second external contact is about 80 μm.

18. The semiconductor device of claim 17, further comprising:

a first redistribution line located between the first external contact and the third external contact; and a second redistribution line located between the first external contact and the third external contact.

19. The semiconductor device of claim 18, wherein the first redistribution line has a width of between about 2 μm and about 14.5 μm.

20. The semiconductor device of claim 15, wherein the first underbump metallization comprises a rectangular shape in a top down view.

\* \* \* \* \*